United States Patent
Kawakubo et al.

[11] Patent Number: 5,952,687
[45] Date of Patent: Sep. 14, 1999

[54] SEMICONDUCTOR MEMORY DEVICE HAVING A TRENCH CAPACITOR WITH LOWER ELECTRODE INSIDE THE TRENCH

[75] Inventors: Takashi Kawakubo; Kazuhiro Eguchi; Shuichi Komatsu, all of Yokohama; Kazuhide Abe, Kawasaki, all of Japan

[73] Assignee: Kabushiki Kaisha Toshiba, Kawasaki, Japan

[21] Appl. No.: 08/889,324

[22] Filed: Jul. 8, 1997

Related U.S. Application Data

[62] Division of application No. 08/527,581, Sep. 13, 1995, Pat. No. 5,691,219.

[51] Int. Cl.$^6$ .................................................. H01L 29/68
[52] U.S. Cl. ..................... 257/296; 257/298; 257/300; 257/301; 257/302; 257/303; 257/304; 257/308; 257/309; 257/311
[58] Field of Search ........................... 257/68, 71, 296, 257/298, 300–309, 311, 532, 762–764

[56] References Cited

U.S. PATENT DOCUMENTS

| | | | |
|---|---|---|---|
| 5,189,503 | 2/1993 | Suguro et al. | 257/310 |
| 5,206,183 | 4/1993 | Dennison | 437/47 |
| 5,238,862 | 8/1993 | Blalock et al. | 437/919 |
| 5,381,365 | 1/1995 | Ajika et al. | 257/309 |
| 5,391,511 | 2/1995 | Doan et al. | 437/919 |
| 5,418,180 | 5/1995 | Brown | 437/52 |
| 5,432,732 | 7/1995 | Ohmi | 257/304 |
| 5,478,772 | 12/1995 | Fazan et al. | 437/60 |
| 5,572,052 | 11/1996 | Kashihara et al. | 257/295 |
| 5,698,869 | 12/1997 | Yoshimi et al. | 257/347 |

FOREIGN PATENT DOCUMENTS 7-30077  1/1995  Japan .

*Primary Examiner*—Fetsum Abraham
*Attorney, Agent, or Firm*—Oblon, Spivak, McClelland, Maier & Neustadt, P.C.

[57] ABSTRACT

A semiconductor memory device having a semiconductor substrate, an insulating layer provided on the substrate, and a memory cell. The memory cell has a switching transistor provided on the substrate and a charge storage element in a trench made in the insulating layer. The charge storage element has a bottom electrode, a dielectric layer and a top electrode deposited one on another in the order mentioned.

11 Claims, 7 Drawing Sheets

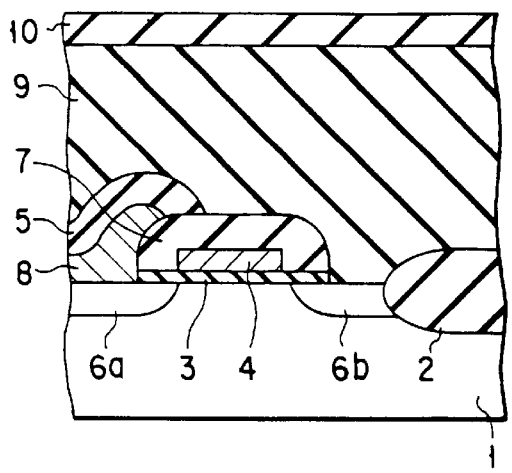
F I G. 5A
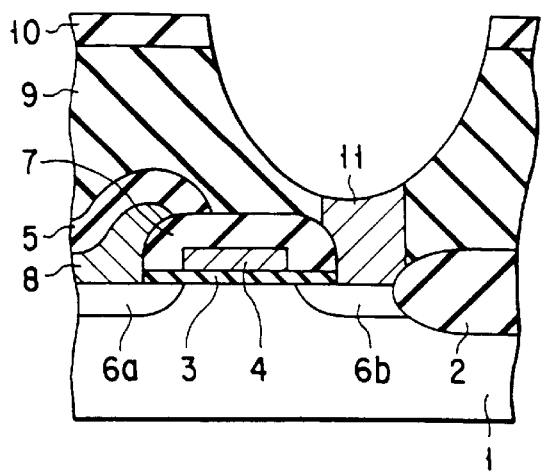
F I G. 5B
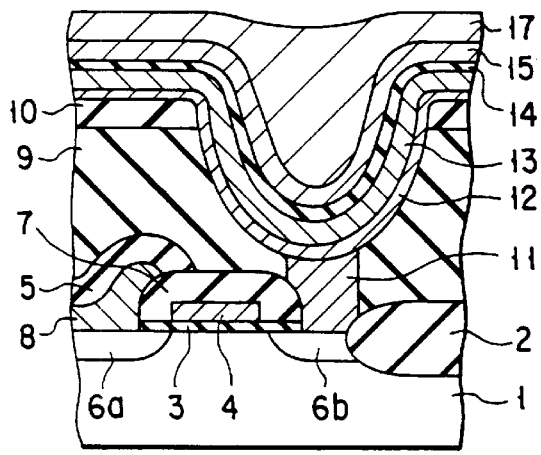
F I G. 5C
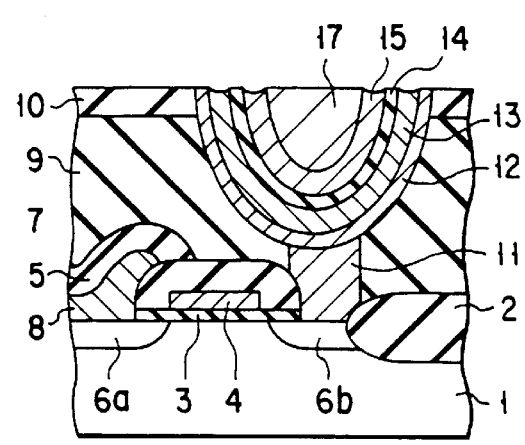
F I G. 5D
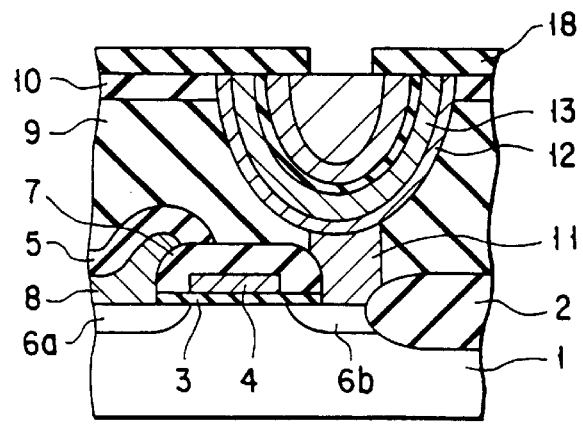
F I G. 5E

SEMICONDUCTOR MEMORY DEVICE HAVING A TRENCH CAPACITOR WITH LOWER ELECTRODE INSIDE THE TRENCH

This is a Division, of application Ser. No. 08/527,581 filed on Sep. 13, 1995 U.S. Pat. No. 5,691,219.

BACKGROUND OF THE INVENTION

1. Field of the Invention

The present invention relates to a semiconductor memory device and a method of manufacturing the same. More particularly, it relates to a semiconductor memory device comprising switching transistors and charge storage capacitors arranged above the switching transistors and also to a method of manufacturing this semiconductor memory device.

2. Description of the Related Art

Owning to the advancement of integration-circuit technology, semiconductor memories are made smaller and smaller. Capacitors, which are circuit elements indispensable to a semiconductor memory, should therefore be made as small as possible. To form small capacitors in a high density, two methods have hitherto been employed. The first method is to make grooves in the same substrate in which active elements such as transistors are formed and then form charge storage layers in the grooves, forming trench capacitors. The second method is to form charge storage layers, one upon another, on a substrate, forming stacked capacitors. Either method provides a relatively large charge storage area.

Thin-film capacitors have not been made as small as desired, unlike the active elements such as switching transistors. Consequently, it is difficult to increase the integration density of semiconductor memories. Thin-film capacitors cannot be miniaturized because they are made of dielectric material having a dielectric constant of 10 at the most, such as $SiO_2$ and $Si_3N_4$. To provide smaller thin-film capacitors it is necessary to develop and use dielectric material which has a high dielectric constant.

Known as materials having a high dielectric constant are perovskite oxides such as $SrTiO_3$, $BaTiO_3$, $PbTiO_3$ and $PbZrO_3$. More specifically, they are known to have dielectric constants ranging from 100 to 1000, either singly or in combination (i.e., a solid solution). Therefore, they are used as materials of ceramic capacitors. Thin film of a perovskite oxide is useful in providing small thin-film capacitors. Researches have long been conducted on thin-film capacitors made of perovskite oxides, showing that these thin-film capacitors have relatively good characteristics.

Thin film having a high dielectric constant, such as $SrTiO_2$ thin film, can be formed at high temperature only. It is formed on electrodes of noble metal such as platinum, palladium and gold or an oxide thereof. Electrodes made of noble metal or an oxide thereof can hardly be used in various integrated circuits (e.g., memory-cell arrays), most of which are formed on silicon substrates. The reasons are as follows:

The primary reason is that no satisfactory processing technology has been established to form small electrodes of noble metal or an oxide thereof since the vapor pressure of any halogen compound of noble metal is far less than desired for performing photolithography and plasma etching on film of noble metal or an oxide thereof. Various methods of forming thin-film capacitors by using material having a high dielectric constant are known. In the method disclosed in Jpn. Pat. Appln. KOKAI Publication No. 4-80952, a bottom electrode, a film having a high dielectric constant, and a top electrode are deposited, one upon another, on the inter-layer insulating film formed on element-isolating film, bit lines and word lines. In the method disclosed in Jpn. Pat. Appln. KOKAI Publication No. 3-256358, a thin-film capacitor is formed on a flat insulating film. In the method disclosed in Jpn. Pat. Appln. KOKAI Publication No. 4-206569, a film having a high dielectric constant is formed on the flat upper surface of a bottom electrode. In all these methods exemplified, an electrically conductive film is processed in a micro-pattern by means of photolithography and plasma etching. Since the bottom electrodes are formed by photolithography and plasma etching in these known methods, it will be difficult to provide reliable bottom electrodes for an integrated circuit at a sufficiently high yield if the bottom electrodes are made from film of noble metal or an oxide thereof.

When thin-film capacitors including film having a high dielectric constant are used to increase the integration density of the integrated circuit, the capacitors must be arranged three-dimensionally so that each capacitor may accumulate great amount of electric charge. To arrange the capacitors so, it is necessary to provide micro-patterning of bottom electrodes. However, processing technology capable of forming such micro-patterned electrodes has not been established yet, as mentioned above.

FIG. 1 shows a known memory cell having a trench capacitor. In the surface of an Si substrate 1 of a first conductivity type, there are formed impurity regions 6a and 6b of the second conductivity type. A gate-insulating film 3 is provided on the impurity regions 6a and 6b and that portion of the Si substrate 1 which lies between the impurity regions 6a and 6b. A word line 4 is provided on the gate insulating film 3. That portion of the Si substrate 1, the gate insulating film 3, the impurity regions 6a and 6b, and the word line 4 constitute a transistor. A trench is made in the Si substrate 1, located near the transistor. A silicon bottom electrode 43, a thermally-oxidized silicon dielectric layer 44, and a top electrode 15 are formed, one upon another, in the trench, forming the trench capacitor. The trench capacitor is connected to the impurity region 6b, whereas a bit line 8 is connected to the impurity region 6a. The memory cell of FIG. 1 further comprises an inter-layer insulating film 7 and an insulating film 9. The film 9 is the top layer of the structure, having a flat upper surface. Where a high dielectric constant film is used in this memory cell, it has the drawback that Ba, Sr or Pb contained in the high dielectric constant film 14 and the noble metal (e.g., Pt) forming the bottom electrode 13 would diffuse into the impurity regions 6a and 6b.

FIG. 2 shows a known memory cell having a stacked capacitor. As shown in FIG. 2, a capacitor having a convex shape and comprised of a bottom electrode 13, a high dielectric constant film 14 and a top electrode 15 is located above a Si substrate 1. A transistor is formed of a portion of the Si substrate 1, a gate-insulating film 3, impurity regions 6a and 6b and the word line 4. The capacitor and the transistor are isolated from each other by an insulating layer. The high dielectric constant film 14 is used in place of conventional utilized silicon oxide film or silicon nitride film, either conventionally utilized. The film 14 is deposited on the convex surface. If formed by sputtering or chemical vapor deposition (CVD), the high dielectric constant film 14 fails to have a uniform thickness.

SUMMARY OF THE INVENTION

An object of the present invention is to provide a semiconductor memory device which has thin-film capacitors, each having a three-dimensional structure and comprising a bottom electrode containing noble metal and a thin film having a high dielectric constant, capable of accumulating a great amount of electric charge, and which can be made in a small size and a high integration density.

Another object of the present invention is to provide a method of manufacturing a semiconductor memory device, in which bottom electrodes containing noble metal can be formed without performing photolithography or plasma etching.

According an aspect of the invention, there is provided a semiconductor memory device comprising a semiconductor substrate, an insulating layer formed on the substrate and having a trench, and a memory cell having a switching transistor formed in the substrate and a charge storage element formed in the trench. The charge storage element comprises a bottom electrode, a dielectric layer and a top electrode formed one on another in the order mentioned.

According to another aspect of this invention, there is provided a method of manufacturing a semiconductor memory device, comprising the steps of: forming a switching transistor on a semiconductor substrate; forming an insulating layer on the substrate; forming a trench in the insulating layer; forming a conductive layer in the trenches and on the insulating layer; and polishing and removing those portions of the conducive layer which are provided on the insulating layer, thereby forming a bottom electrode for a charge storage element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5A to 5E are sectional views explaining the steps of manufacturing one of the memory cells incorporated in a semiconductor memory device according to a third embodiment of the invention;

DETAILED DESCRIPTION OF THE PREFERRED EMBODIMENTS

A semiconductor memory device according to the present invention comprises a semiconductor substrate and memory cells. Each memory cell comprises a switching transistor provided on the substrate, an insulating layer covering the substrate, and a charge storage element provided in the insulating layer. The charge storage element is formed of a bottom electrode and a dielectric layer which are formed, one upon the other, in a trench made in the insulating layer The bottom electrode of each charge storage element can be made of a noble metal such as platinum, gold, palladium, rhodium, iridium, ruthenium, rhenium or the like, an alloy of any one of these metals, or an oxide of any one of these metals. Alternatively, the bottom electrode may be made of a conductive oxide of a metal other than noble metal.

Examples of the alloys of noble metal are Pt—W, Pt—Sn, Pt—Ru, Pt—Ti, Pt—Si and the like. Examples of the conductive oxide are (Sr, Ca, RE)$TiO_3$ and (RE)$NiO_3$ (Re: Y or the other rare earth element) each having a perovskite structure, and the like.

The dielectric layer is made of preferably high dielectric constant material or ferroelectric material having either perovskite or layered perovskite structure. The depth of the trench is not limited particularly, but may not exceeds three times the width. If the trench is more than three times as deep as it is wide, it may be difficult to form the dielectric layer by means of ordinary sputtering or CVD. Usually, the depth of the trench is equal to the width, ranging from 300 to 3000 Å.

Figure 1:
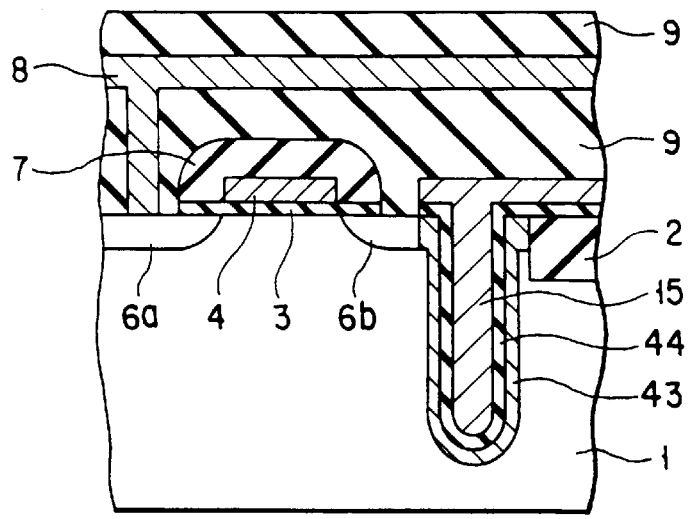
FIG. 1 is a sectional view of a type of a conventional memory cell.
Figure 2:
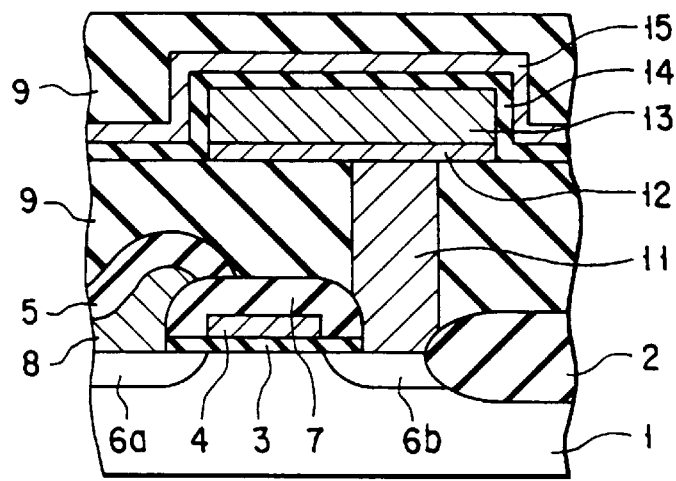
FIG. 2 is a sectional view of another type of a conventional memory cell.

As described above, each charge storage element is provided in a trench located above the switching transistor. The dielectric layer is deposited on the bottom electrode which in turn is deposited on the inner surface of the trench. The dielectric layer can therefore have a thickness more uniform than the high dielectric constant film 14 of the stacked capacitor shown in FIG. 2, which is deposited on the surface of the convex bottom electrode 13. The dielectric layer is therefore desirable for use in a charge storage element which needs to have a high dielectric constant and a small leakage current.

The inventors hereof conducted experiments, in which high dielectric constant film of (Ba, Sr)$TiO_3$ was formed on the substrate having a trench by means of magnetron sputtering and by means of metal-organic chemical vapor deposition (MOCVD). More precisely, the trench was 0.3 μm wide and 1 μm deep, and the film was deposited to a thickness of 50 nm. Dielectric film, thus formed, was examined for the thicknesses of the three portions deposited on the flat surface of the layer, the side wall of the trench and the bottom thereof. The thickness ratio of the three portions of the highly dielectric film deposited by sputtering was about 1:0.5:0.4. On the other hand, the thickness ratio of the three portions of the film deposited by MOCVD was approximately 1:0.6:0.5. Thus, a thin dielectric film having a uniform and small thickness can be obtained by polishing and removing the thick portion of the film from the flat surface of the layer.

As described above, the charge storage element and the switching transistor are electrically isolated from each other by the insulating layer. Therefore, the material of the charge storage element is prevented from diffusing into the impurity region formed in the surface of the semiconductor substrate if a barrier metal layer is provided below the bottom electrode.

A method of manufacturing a semiconductor memory device, according to the present invention, comprises the steps of: forming switching transistors on a semiconductor substrate; forming an insulating layer on a semiconductor substrate having a switching transistor formed therein to form a flat upper surface; forming a trench in the insulating layer; forming a conductive layer in an inner surface of the trench and on the insulating layer; and polishing the conductive layer to remove that portion of the conducive layer which is provided on the insulating layer, thereby forming a bottom electrode for charge storage element.

In the method it is desirable that a polishing-stop layer be provided o the flat surface of the insulating layer. The polishing may be mechanical one or chemical-mechanical one.

If chemical-mechanical polishing is employed, it is desirable to use a polishing solution which contains a halogen, a halogen salt and an organic solvent. The polishing solution dissolves the noble metal contained in the conductive layer, without dissolving the oxide film or barrier metal film which is provided beneath the conductive layer. The use of the polishing solution shortens the time of polishing. Ultimately, the polishing solution decreases the manufacturing cost of the semiconductor memory device.

The organic solvent contained in the polishing solution is preferably one that does not react with halogens. Examples of the solvent are aromatic hydrocarbon, alcohol, ester, nitrile, nitro-compound, and halogenated hydrocarbon. Of these, acetonitrile, xylene, toluene and benzene are particularly preferable.

The halogen salt contained in the polishing solution is preferably one which has properties similar to those of a surfactant, such as cetylpyridinium iodide or the like. A halogen salt whose cation is an alkali metal ion, an alkali earth metal ion, a quarternary ammonium ion or the like can be utilized in the polishing solution.

The halogen salt contained in the polishing solution is preferably one which has a high electro-negativity and one which does not react with organic solvent.

In the method according to the present invention, a part of the bottom electrode of the charge storage element is polished and removed, thereby electrically isolating the element from the adjacent charge storage element. A layer of noble metal such as platinum, which is provided beneath the highly dielectric film, need not be micro-processed to form bottom electrodes, by means of photolithography or plasma etching as in the conventional method of manufacturing a semiconductor memory device. In other words, with the method of the present invention it suffices to perform photo-lithography or plasma etching only on layers of silicon oxide or the like, and it is possible to form a thin-film capacitor which is small and which has a high electric storage capacity. The semiconductor memory device manufactured by the method of this invention can have high integration density.

Where the conductive layer made of soft noble metal such as platinum, gold, palladium, rhodium or the like is subjected to mechanical polishing or chemical-mechanical polishing, the layer will undergo so-called "metal flow." The more prominent the metal flow, the less surface smoothness the layer will have. Prominent metal flow, if any, will result in the problem that the bottom electrode and the top electrode of the charge storage element are short-circuited to each other. This problem can be solved by using a conductive layer of noble metal alloy or electrically conductive oxide which has a resistivity of 100 $\mu\Omega$cm or less and Vickers hardness of 80 or more. That as, metal flow can be prevented by using a conductive layer made of a noble metal alloy which has been prepared by adding an appropriate amount of an additive to noble metal and which has sufficient electrical conductivity and a proper hardness.

Platinum, an example of pure noble metal, has a relatively low resistivity of 10 $\mu\Omega$cm or less, but is a soft metal having Vickers hardness of 40 or less. Generally, when pure metal is added with another metal, the resultant alloy has electrical conductivity higher than that of the pure metal and hardness greater than that of the pure metal. As material of electrodes, metal should not acquire an increased resistivity, but should better acquire an increased hardness so as to be readily processed by either mechanical polishing or chemical-mechanical polishing. Thus it is necessary to add an appropriate element to noble metal (e.g., platinum) to provide an alloy which has a sufficient hardness and an adequate electrical conductivity, so that a layer of the alloy may be polished in part to form the bottom electrode of a thin-film capacitor.

Examples of such an additive element are a solid-solution element such as W, Ni, Cu, Ru or the like and a precipitation-type element such as Sn, Ti, Si or the like.

W (a solid-solution element) was added in various amount Pt, providing Pt—W bulk alloys. Each Pt—W alloy was examined for resistivity and hardness. The Pt—W alloy containing 2 wt % of W had resistivity of about 23 $\mu\Omega$cm and Vickers hardness of about 100. The Pt—W alloy containing 4 wt % of W had resistivity of about 37 $\mu\Omega$cm and Vickers hardness of about 135. The Pt—W alloy containing 6 wt % of W had resistivity of about 55 $\mu\Omega$cm and Vickers hardness of about 145.

An electrode of a thin-film capacitor needs to have resistivity of 100 $\mu\Omega$cm or less and Vickers hardness of 100 or more. In view of this, Pt—W alloys containing 2 to 6 wt % of W can be used as material of the electrode of a thin-film capacitor.

Sn (a precipitation-type element) was added in various amount to Pt, providing Pt—Sn bulk alloys. Each Pt—Sn alloy was examined for resistivity and hardness. The Pt—Sn alloys containing at most 7 wt % to Sn were Pt—Sn solid solutions. In any Pt—Sn alloy containing more than 7 wt % of Sn, $Pt_3Sn$ was precipitated, decreasing the resistivity to a value close to the resistivity of Pt and increasing the hardness to 100 or more in Vickers scale. In particular, Pt—Sn alloys containing 10 to 15 wt.% of Sn are preferred as material of the electrode of a thin-film capacitor.

Any precipitation-type element other than Sn may be added to Pt to provide a Pt alloy which has resistivity and hardness which are, respectively low and high enough to be utilized as material of the electrode of a thin-film capacitor.

Various embodiments of the present invention will be described below, with reference to the accompanying drawings.

Embodiment 1

Figure 3:
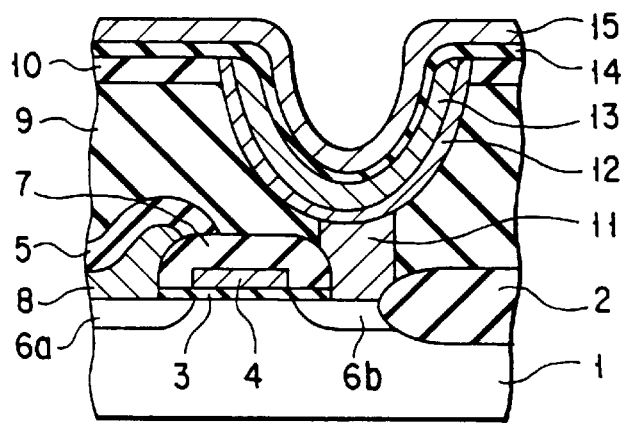
FIG. 3 is a sectional view of one of the memory cells incorporated in a semiconductor memory device according to a first embodiment of this invention.

FIG. 3 is a sectional view of a semiconductor memory device according to the first embodiment of the present invention. As shown in FIG. 3, a semiconductor substrate 1 of a first conductivity type has a portion electrically isolated from any other portion by element-isolating film 2. In this portion of the substrate 1 there are provided two impurity regions 6a and 6b of the second conductivity type. A gate-insulating film 3 is provided on the substrate 1. A word line 4 is mounted on the gate-insulating film 3. The substrate 1, the gate-insulating film 3, the word line 4, and the regions 6a and 6b constitute a switching transistor.

An insulating layer 9 having a flat upper surface is provided covering the switching transistor. A trench is made in the insulating layer 9. In the trench, a barrier metal film 12, a bottom electrode 13, a highly dielectric film 14, and a top electrode 15 are formed, one upon another in the order mentioned, providing a thin-film capacitor.

The thin-film capacitor is connected by a contact plug 11 to the impurity region 6b of the transistor. The bit line 8 is connected to the impurity region 6a. Reference numerals 5, 7 denote interlayer insulating films, and 10, polishing-step layer.

How the semiconductor memory device shown in FIG. 3 was manufactured will be explained, with reference to FIGS. 4A to 4E.

Figure 4A:
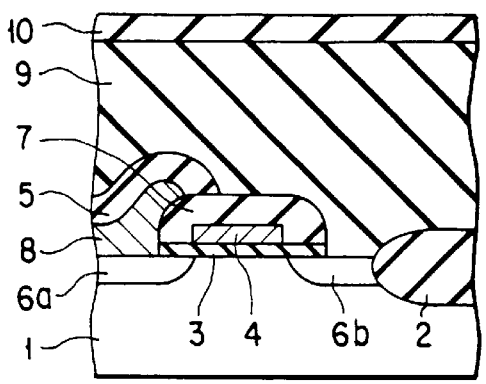
FIGS. 4A to 4E are sectional views explaining the steps of manufacturing the memory cell shown in FIG. 3.

First, as shown in FIG. 4A, the switching transistor of a memory cell and the bit line 8 were formed on the semiconductor substrate 1 of a first conductivity type. The flattening insulating layer 9 made of boronsilicate glass (BSG) was formed, covering the entire surface of the structure. The insulating layer 9 was processed to have a flat upper surface. This may be achieved by either etch-back method or chemical-mechanical polishing. Thereafter, the polishing-stop layer 10 was formed on the flat upper surface of the insulating layer 9. The layer 10 was an aluminum oxide layer.

Figure 4B:
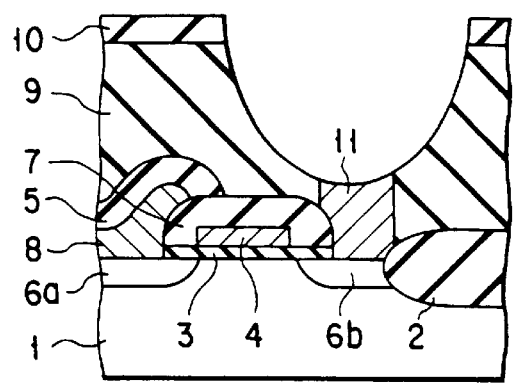

Next, as shown in FIG. 4B, photolithography and plasma etching, both being known techniques, were performed on the polishing-stop layer 10 and the insulating layer 9, thereby forming a contact hole in the layers 9 and 10. Polysilicon was deposited in the contact hole by LPCVD method, forming the contact plug 11. Phosphorus was diffused into the polysilicon deposited in the contact hole thereby decreasing the resistivity of the polysilicon to 10 to 100 $\Omega/\square$. Photolithography and plasma etching were performed again on the layers 10 and 9, forming a trench in the layers 10 and 9. The insulating layer 9 can be replaced by any layer which can be easily etched, such as a semiconductor layer or a resist.

Figure 4C:
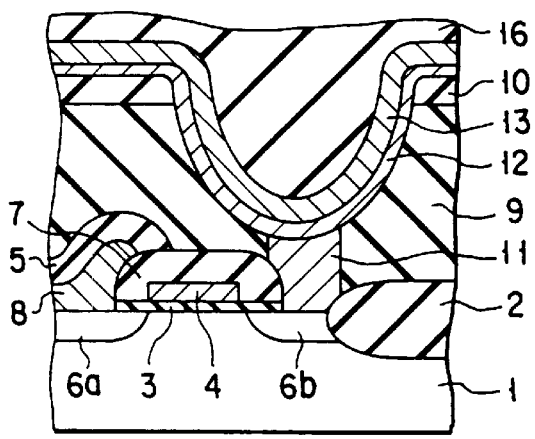

Then, as shown in FIG. 4C, the barrier metal film 12 made of titanium nitride was formed partly on the polishing-stop layer 10 and partly on inner surface of the trench. At one additional barrier metal may be formed, if desired. The bottom electrode 13 made of iridium was formed on the barrier metal film 12. Further, on the bottom electrode 13 there was formed a flattening insulating layer 16 made of boronsilicate glass (BSG). It should be noted that the barrier metal film 12 can be made of titanium, tantalum, tantalum nitride or the like, instead of titanium nitride. A film made of semiconductor, conductor, or resist can be used instead of the flattening insulating layer 16.

Figure 4D:
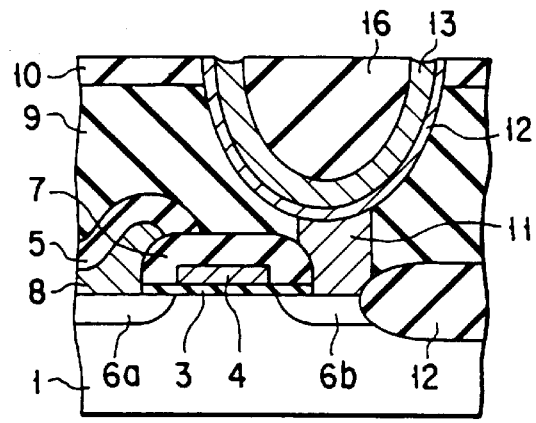

Thereafter, as shown in FIG. 4D, those portions of the barrier metal film 12, bottom electrode 13 and insulating layer 16, which were deposited on and above the polishing-stop layer 10, were removed by means of mechanical polishing. Mechanical polishing was used since the barrier metal film 12 and the bottom electrode 13 were very thin, 100 nm or less and could be well removed by mechanical polishing in which colloidal silica is used as abrasive medium. Alternatively, they could be removed by chemical-mechanical polishing which scarcely damages the objects being polished.

Next, the insulating layer 16 was removed by plasma etching, exposing the bottom electrode 13. Then, the high dielectric constant film 14 made of $Ba_{0.5}Sr_{0.5}TiO_3$ was formed partly on the polishing-stop layer 10 and partly on the bottom electrode 13. The upper electrode 15 made of platinum was formed on the film 14. As a result, the semiconductor memory device of the structure shown in FIG. 4E was obtained. Although not shown in FIG. 4E, an inter-layer insulating film is provided on the top electrode 15, and an Al interconnect is provided on this inter-layer insulating film.

The high dielectric constant film 14 can be deposited to a relatively uniform thickness by means of magnetron sputtering or MOCVD, either being known method, provided that the trench has an aspect ratio (i.e., the width-to-depth ratio) of about 1.

Generally, a charge storage capacity per unit area and the leakage current, which may flow therefrom, of a high dielectric constant film depend on the thickness of the film. Since the high dielectric constant film 14 has a uniform thickness, the thin-film capacitor of the memory cell shown in FIG. 4E has but a small leakage current and a high charge storage capacity. By contrast, the convex capacitor shown in FIG. 2 can neither have a small leakage current nor a high charge storage capacity. This is because the high dielectric constant film 14 formed by sputtering or CVD is much more thick on the top of the bottom electrode 13 than on the sides thereof 13.

Embodiment 2

A semiconductor memory device of the same type as Embodiment 1 was manufactured in the same method explained with reference to FIGS. 4A to 4E, except that the bottom electrode 13 was made of Pt—W alloy containing 4 wt % of W and that chemical-mechanical polishing was employed.

More specifically, Pt—4%w alloy was deposited by DC sputtering on the barrier metal film 12, thereby forming a Pt—4%W film 13. The PT—4%W film had resistivity of about 38 $\mu\Omega$cm and Vickers hardness of about 135. Then, a flattening insulating layer 16 was formed on the Pt—4%W film 13 thus formed.

Next, as shown in FIG. 4D, those portions of the barrier metal film 12, bottom electrode 13 and insulating layer 16, which were deposited on and above the polishing-stop layer 10, were removed by means of chemical-mechanical polishing. No "metal flow" was observed at the bottom electrode 13; the electrode 13 was polished thoroughly. The polishing solution used was one containing bromine, cetylpyridinium bromide and benzene. The solution had been heated to 30° C. before it was applied. After the chemical-mechanical polishing, the structure of FIG. 4D was washed with alcohol.

Figure 4E:
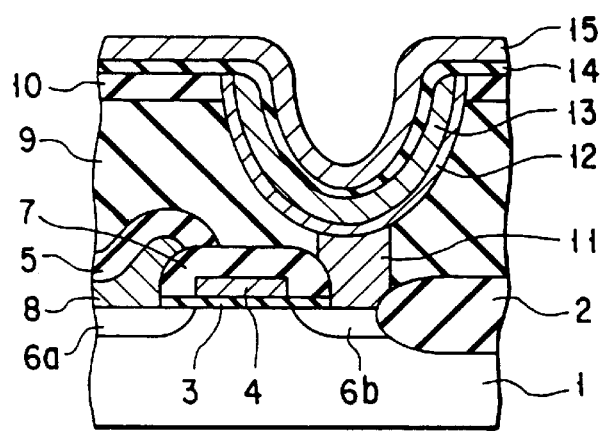

Thereafter, in the same procedure as Embodiment 1, a semiconductor memory device of the same structure as shown in FIG. 4E was obtained.

The semiconductor memory device thus manufactured attained the same advantages as the semiconductor memory device according to Embodiment 1.

Embodiment 3

A semiconductor memory device was manufactured by a method which is illustrated in FIGS. 5A to 5E. The steps of manufacturing the device, shown in FIGS. 5A and 5B, are identical to the steps shown in FIGS. 4A and 4B, of manufacturing Embodiment 1.

As shown in FIG. 5C, a barrier metal film 12 made of TiN, a bottom electrode 13 made of Pt, a high dielectric constant film 14 made of $Ba_{0.5}Sr_{0.5}TiO_3$, a top electrode 15 made of Pt, and a flattening insulating layer 17 were deposited, one upon another, in the order mentioned. The flattening conductive layer 17 was made of doped semiconductor material, such as doped polysilicon.

Then, as shown in FIG. 5D, those portions of the barrier metal film 12, bottom electrode 13, the high dielectric constant film 14, the top electrode 15, and the flattening conductive layer 17, which were deposited on and above the polishing-stop layer 10, were removed by means of either mechanical polishing or chemical-mechanical polishing. As a result, the structure came to have a flat upper surface.

Further, as shown in FIG. 5D, an inter-layer insulating film 18 was formed, covering the edges of the films 12, electrode 13, film 14 and electrode 15. As a result, a thin-film capacitor was obtained in the trench.

Embodiment 4

A semiconductor memory device of the same type as Embodiment 3 was manufactured by the same method (FIGS. 5A to 5E) as Embodiment 3, except that the bottom electrode 13 was made of a Pt—Ru alloy containing 4 wt % of Ru.

More specifically, as shown in FIG. 5C, a barrier metal film 12 was formed partly on the polishing-stop layer 10 and partly in the inner surface of the trench. Then, Pt—4%Ru alloy was deposited by DC sputtering on the barrier metal film 12, thereby forming a Pt—4%Ru film 13. The PT—4%Ru film 13 had resistivity of about 28 $\mu\Omega$cm and Vickers hardness of about 115.

Embodiment 5

Figure 6:
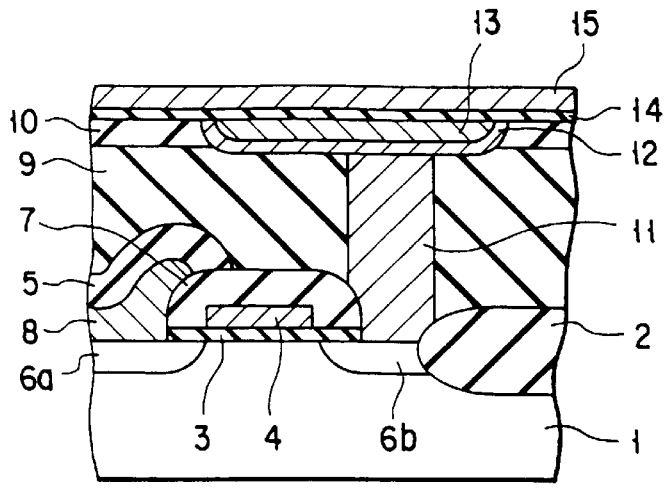
FIG. 6 is a sectional view showing one of the memory cells provided in a semiconductor memory device according to a fifth embodiment of the invention.

FIG. 6 is a sectional view showing one of the memory cells which are provided in a semiconductor memory device according to the fifth embodiment of the invention. The memory cell shown in FIG. 6 differs from those of Embodiments 1 to 4 in that a very shallow trench was formed in an insulating layer 9, then, the barrier metal film 12 and the bottom electrode 13 were deposited partly in the shallow trench and partly on the polishing-stop layer 10, and finally, those portions of the film 12 and the electrode 13 which are provided on the polishing-stop layer 10 were removed by either mechanical polishing or chemical-mechanical polishing, thus processing the bottom electrode 13 into one having a flat upper surface.

Thereafter, a high dielectric constant film 14 and a top electrode 15 were formed, obtaining a thin-film capacitor. The thin-film capacitor is of a planer structure and has a low charge storage capacity than the capacitors of Embodiments 1 and 2. Nevertheless, it is more resistant to electrostatic breakdown (which may occur due to a concentrated electric field) and is, hence, reliable.

Embodiment 6

Figure 7:
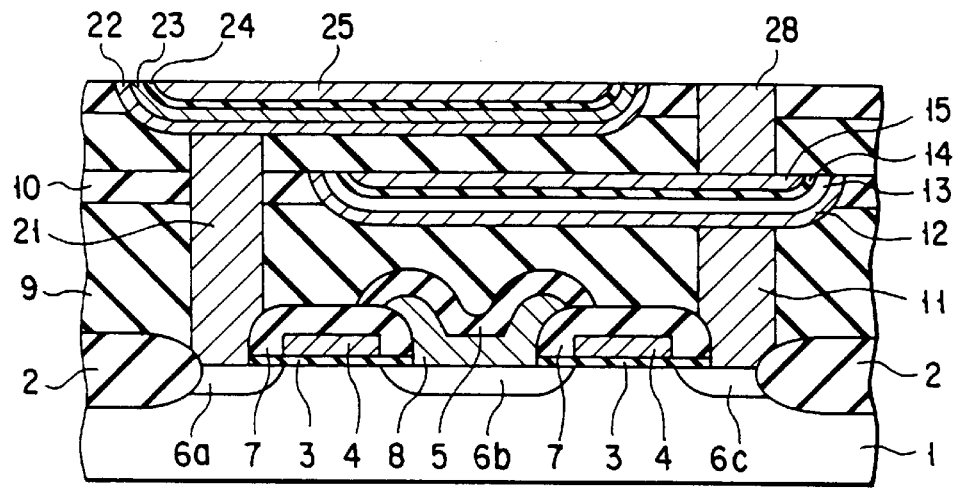
FIG. 7 is a sectional view illustrating two of the memory cells incorporated in a semiconductor memory device according to a sixth embodiment of the present invention.

FIG. 7 is a sectional view illustrating a semiconductor memory device according to the sixth embodiment of the present invention.

As illustrated in FIG. 7, a semiconductor substrate 1 of a first conductivity type has a portion electrically isolated from any other portion by element-isolating film 2. In this portion of the substrate 1 there are provided three impurity regions 6a, 6b and 6c of the second conductivity type. Gate-insulating films 3 are provided partly on the substrate 1. Word lines 4 are mounted on the gate-insulating film 3. The substrate 1, the gate-insulating films 3, the word lines 4, and the regions 6a, 6b and 6c constitute two switching transistors of the memory cell.

A flatting layer 9 is provided covering the switching transistors. A polishing-stop layer 10 is provided on the insulating layer 9. A first shallow trench is made in the insulating layer 9. In the first trench, a barrier metal film 12, a bottom electrode 13, a high dielectric constant film 14, and a top electrode 15 are formed, one upon another in the order mentioned, providing a first thin-film capacitor. The first thin-film capacitor is connected by a contact plug 11 to the impurity region 6c. A bit line 8 is connected to the impurity region layer 6b.

A flattening insulating layer 19 is provided on the first thin-film capacitor, and a polishing-stop layer 20 is provided on the insulating layer 19. A second shallow trench is made in the insulating layer 19. In the second trench, a barrier metal film 22, a bottom electrode 23, a high dielectric film 24, and a top electrode 25 are formed, one upon another in the order mentioned, providing a second thin-film capacitor. The second thin-film capacitor is connected by a contact plug 21 to the impurity region 6c. A bit line 8 is connected to the impurity region 6b.

The memory cell further comprises inter-layer insulating films 5 and 7 and a via hole 28.

How the semiconductor memory device shown in FIG. 7 is manufactured will be explained, with reference to FIGS. 8A to 8F.

Figure 8A:
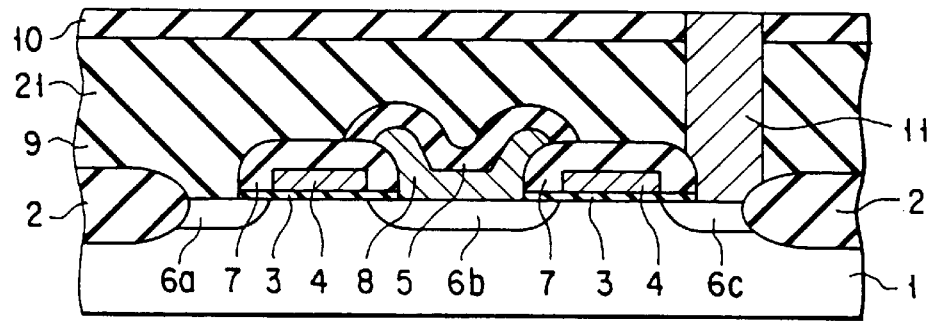
FIGS. 8A to 8F are sectional views explaining the steps of manufacturing the memory cells shown in FIG. 7.

First, as shown in FIG. 8A, the switching transistors of memory cells and the bit line 8 are formed on the semiconductor substrate 1 of the first conductivity type. The insulating layer 9 is formed, covering the element-isolating layer 2, the inter-layer insulating film 5, the impurity regions 6b and 6c, and the inter-layer insulating films 7. Then, the polishing-stop layer 10 is formed on the flat upper surface of the insulating layer 9. A contact hole is made in the layers 9 and 10, exposing the impurity region 6c. The contact hole is filled with electrically conductive material, forming the contact plug 11.

Figure 8B:
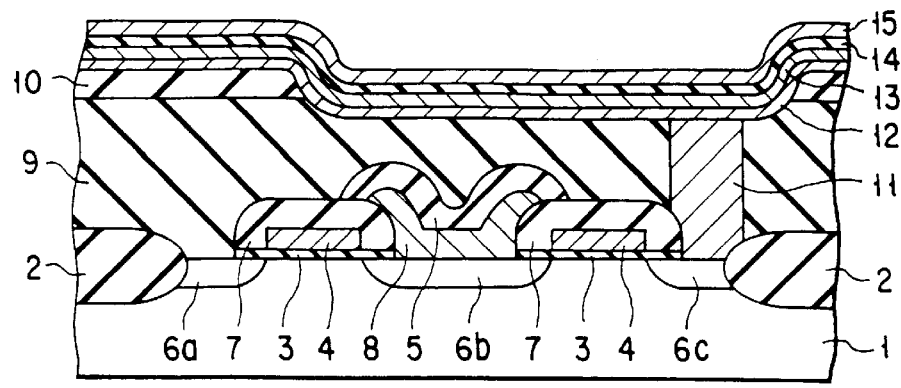

Next, as shown in FIG. 8B, photolithography and plasma etching, both being known techniques are performed on the polishing-stop layer 10 and the insulating layer 9, thereby forming the first shallow trench in the insulating layer 9. Then, the barrier metal film 12 is formed partly on the polishing-stop layer 10 and partly on inner surface of the trench. At one additional barrier metal may he formed, if desired. The bottom electrode 13, the highly dielectric constant film 14 and the top electrode 15 are formed on the barrier metal film 12, on upon another in the order mentioned.

Figure 8C:
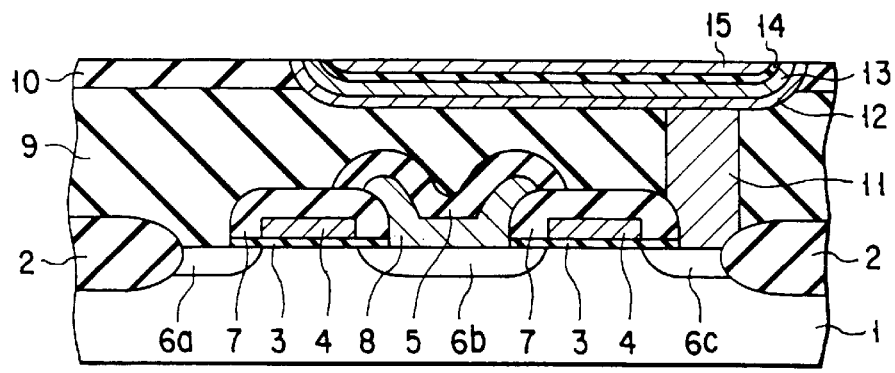

Thereafter, as shown in FIG. 8C, those portions of the barrier metal film 12, bottom electrode 13, the high dielectric constant film 14 and the top electrode 15, which are deposited on and above the polishing-stop layer 10, are removed by means of mechanical polishing. As a result of this, the first thin-film capacitor is provided. Mechanical polishing is used since the barrier metal film 12 and the bottom electrode 13 are very thin, 100 nm or less and can be well removed by mechanical polishing in which colloidal silica is used as abrasive medium. Alternatively, they may be removed by chemical-mechanical polishing which scarcely damages the objects being polished.

Figure 8D:
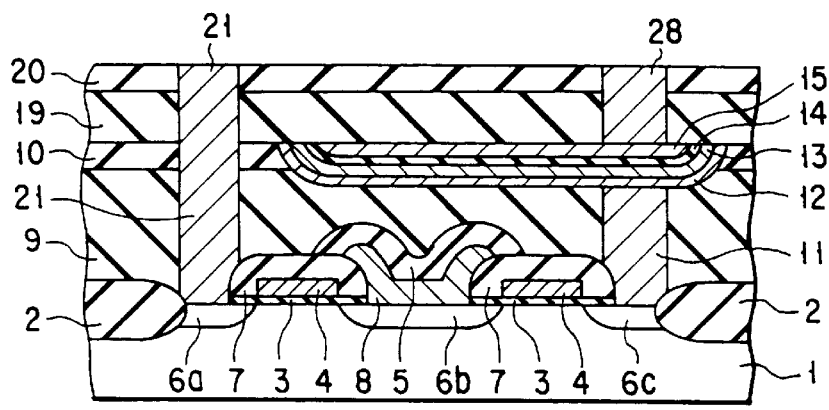

Then, as shown in FIG. 8D, the flattening insulating layer 19 is formed on the first thin-film capacitor. The polishing-stop layer 20 is deposited on the insulating layer 19. A contact hole is made in the layers 9, 10, 19 and 10, exposing the impurity region 6a. The contact hole is filled with electrically conductive material, thereby forming the contact plug 21.

Figure 8E:
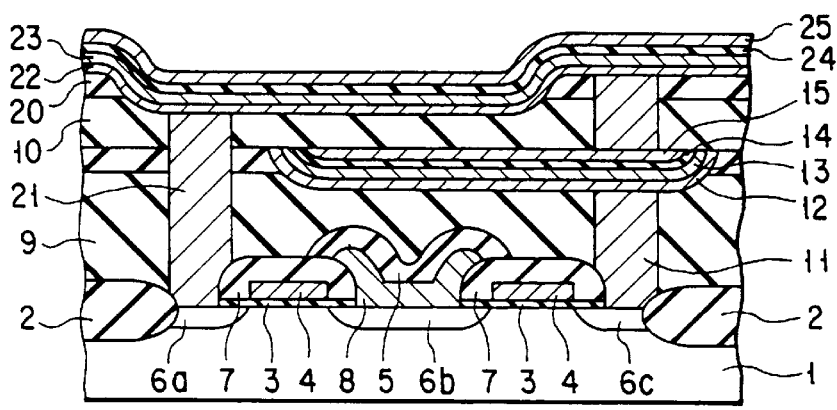

Further, as shown FIG. 8E, the second shallow trench is made in the insulating layer 19, by means of photolithography and plasma etching. Then, the barrier metal film 22, the bottom electrode 23, the high dielectric constant film 24, and the top electrode 25 are deposited, one upon another in the order mentioned, partly in the second trench and partly on the polishing-stop layer 20.

Figure 8F:
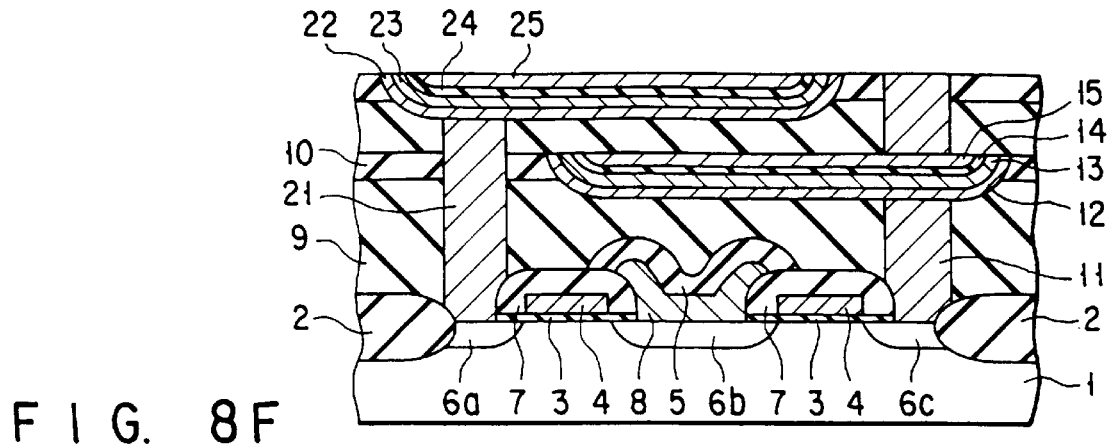

Thereafter, as shown in FIG. 8F, those portions of the barrier metal film 22, bottom electrode 23, highly dielectric constant film 24, and upper electrode 25, which are deposited on the polishing-stop layer 20, are removed by mechanical polishing. As a result, there is formed a second thin-film capacitor which is located above the first thin-film capacitor.

Figure 9:
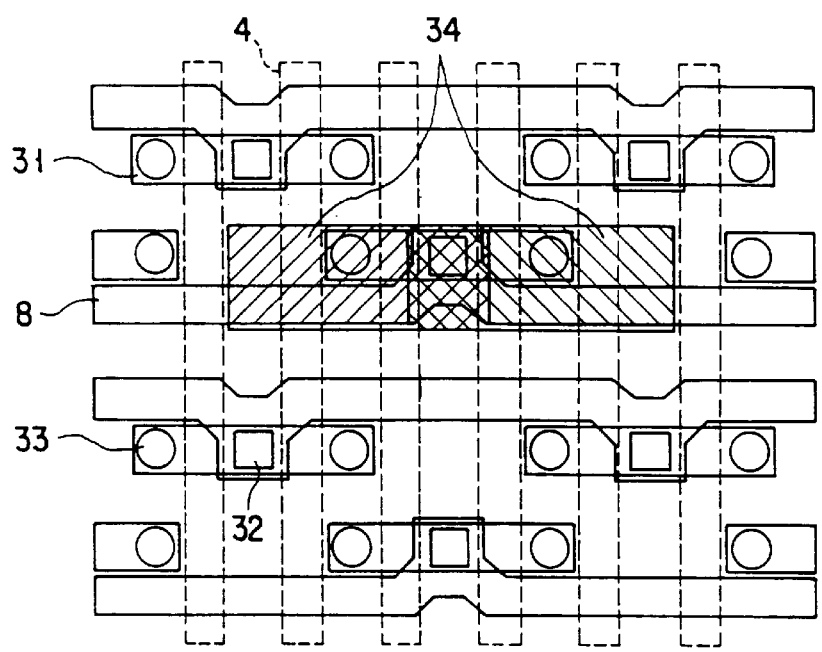
FIG. 9 is a plan view of the memory cells shown in FIG. 7.

FIG. 9 is a plan view of the memory cells used in Embodiment 6 and shown in FIG. 7. As shown in FIG. 7, Embodiment 6 has an active region 31 which includes the channel regions and impurity regions of the switching transistors, contact holes 32 connecting the bit lines 8 to the impurity regions provided in the surface of the substrate 1, contact holes 33 connecting the bottom electrodes of thin-film capacitors to the impurity regions, and thin-film capacitors 34 (only one pair shown) located one above another, partly overlapping the contact holes 33.

Embodiment 7

Figure 10:
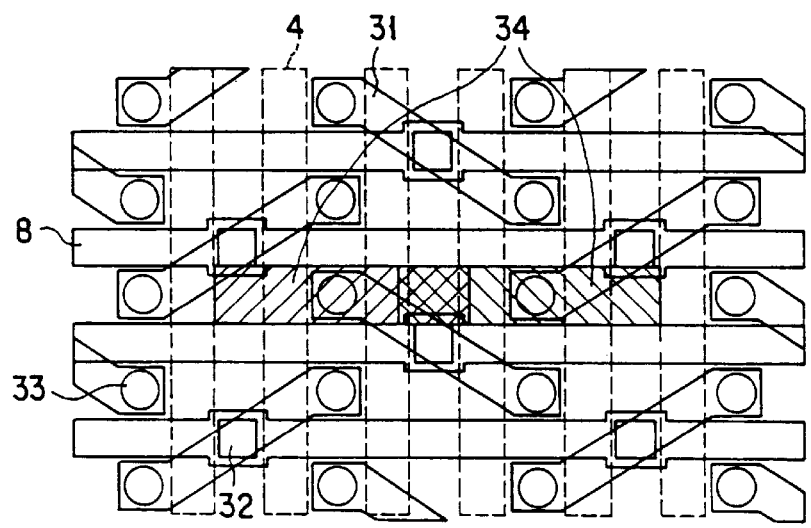
FIG. 10 is a plan view of the memory cells used in a semiconductor memory device according to a seventh embodiment of the invention.

This embodiment is a semiconductor memory device which has the element layout specified in FIG. 10. As illustrated in FIG. 10, active regions 31 are inclined to the word lines 4 and the bit lines 8, increasing the density in which the lines 4 and 8 are arranged. In addition, the thin-film capacitors of any two adjacent memory cells are located, one above the other, so that each capacitor may be twice or more as large as the known capacitors which are located in the same plane. The cross sectional view of Embodiment 7 is identical to the view of FIG. 7, if taken along the line connecting the centers of two contact holes 32 provided in the same active region 31.

Embodiment 8

Figure 11:
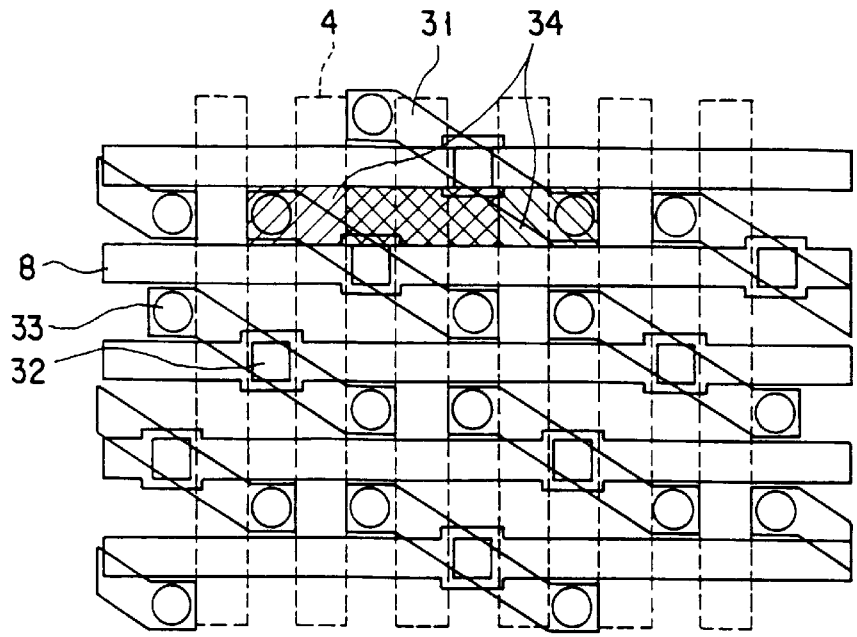
FIG. 11 is a plan view of the memory cells used in a semiconductor memory device according to a eighth embodiment of the invention.

Embodiment 8 is a semiconductor memory device which has the element layout specified in FIG. 11. As seen from FIG. 11, active regions 31 are inclined to the word lines 4 and the bit lines 8. Further, each active region 31 associated with one bit line 8 is shifted by a quarter of its pitch with respect to the adjacent one associated with the next bit line 8. Hence, the density in which the lines 4 and 8 are arranged in an increased density as in Embodiment 7. Also in Embodiment 8, the thin-film capacitors of any two adjacent memory cells are located, one above the other, and each capacitor can be twice or more as large as the known capacitors which are located in the same plane.

Embodiment 9

Figure 12:
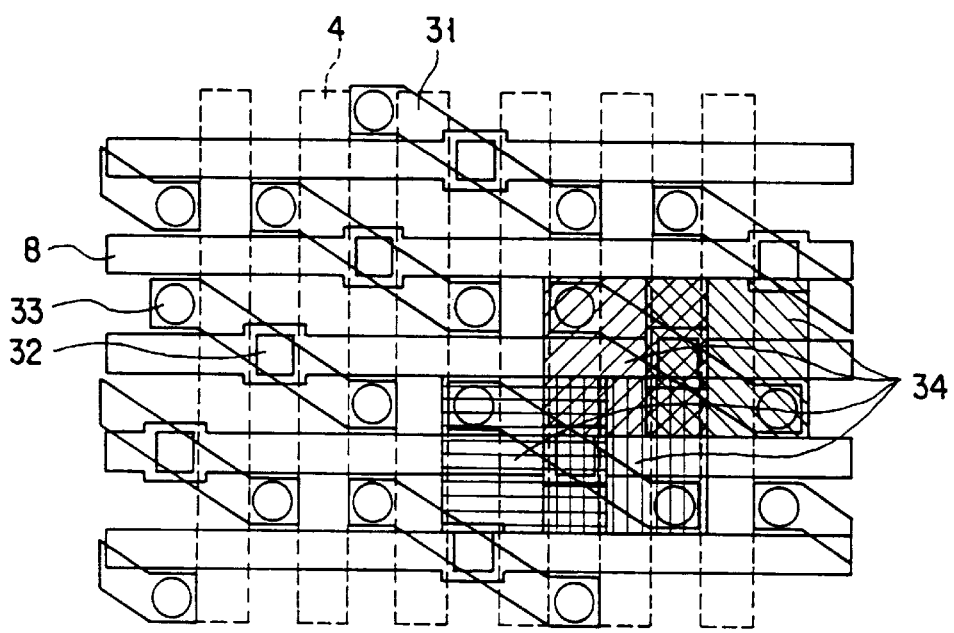
FIG. 12 is a plan view showing the memory cells used in a semiconductor memory device according to a ninth embodiment of the invention.

Embodiment 9 is a semiconductor memory device which has the element layout specified in FIG. 12. This element layout is identical to that of Embodiment 8 (FIG. 11), except that the thin-film capacitors 34 are arranged differently. More precisely, four thin-film capacitors are connected to four switching transistor via four adjacent contact holes 33 are located one above another. Each capacitor can therefore be several times as large as the known capacitors which are located in the same plane.

As has been described, the present invention can provide a semiconductor memory device which has thin-film capacitors, each comprising a bottom electrode containing noble metal or the like and a thin film having a high dielectric constant, and which can have a high integration density, though the bottom electrodes is made of noble metal or the like which can hardly be micro-processed by plasma etching or the like.

Additional advantages and modifications will readily occur to those skilled in n the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
a semiconductor substrate;
an insulating layer provided on the substrate and having a trench and a contact hole formed in a portion of the insulating layer at a bottom of the trench; and
a memory cell having a switching transistor provided on said substrate and a charge storage element provided in the trench, said charge storage element comprising a bottom electrode formed only on an inner surface of the trench, a dielectric layer formed on the bottom electrode and a top electrode formed on the dielectric layer, said bottom electrode being connected to the switching transistor by means of a conductive layer buried in said contact hole.

2. The semiconductor memory device according to claim 1, wherein said bottom electrodes are made of a material selected from the group consisting of a noble metal, a noble metal oxide, a noble metal alloy, and an electrically conductive oxide.

3. The semiconductor memory device according to claim 2, wherein said noble metal is one selected from the group consisting of platinum, gold, palladium, rhodium, iridium, ruthenium, osmium, and rhenium.

4. The semiconductor memory device according to claim 2, wherein said noble metal alloy is an alloy of one noble metal and a metal or a semiconductor, said noble metal being one selected from the group consisting of platinum, gold, palladium, rhodium, iridium, ruthenium, osmium, and rhenium, and said metal or said semiconductor being one selected from the group consisting of W, Ni, Cu, Ru, Sn, Ti and Si.

5. The semiconductor memory device according to claim 2, wherein said noble metal alloy has resistivity of at most 100 $\mu\Omega$cm or less and Vickers hardness of at least 80.

6. The semiconductor memory device according to claim 2, wherein said electrically conductive oxide is one selected from the group consisting of (Ba, Sr, Ca)RuO$_3$, (Ba, Sr, Ca)MoO$_3$, (Sr, Ca, RE)TiO$_3$, and (RE)NiO$_3$ wherein RE is Y or the other rare earth element.

7. The semiconductor memory device according to claim 2, wherein said electrically conductive oxide is resistivity of at most 100 $\mu\Omega$cm or less and Vickers hardness of at least 80.

8. The semiconductor memory device according to claim 1, wherein said dielectric layer is made of a material selected from the group consisting of (Ba, Sr, Ca) (Ti, Zr, Hf, Sn)O$_3$, and Pb(Zr, Ti, La)O$_3$.

9. The semiconductor memory device according to claim 1, wherein a barrier layer is interposed between said trench and said bottom electrode.

10. The semiconductor memory device according to claim 9, wherein said barrier layer is made of a material selected from the group consisting of titanium, tantalum, tangsten, titanium nitride, tantalum nitride, and tangsten nitride.

11. The semiconductor memory device according to claim 1, wherein said charge storage element is partly overlapped with a word line of said switching transistor.

* * * * *

UNITED STATES PATENT AND TRADEMARK OFFICE
CERTIFICATE OF CORRECTION

PATENT NO. : 5,952,687

DATED : September 14, 1999

INVENTOR(S): Takashi KAWAKUBO, et al

It is certified that an error appears in the above-identified patent and that said Letters Patent is hereby corrected as shown below:

On the title page, item [30] is missing:

-- [30] Foreign Application Priority Data
    Sep. 17, 1994    [JP]    Japan ............................. 6-248444 --

Signed and Sealed this

Twentieth Day of June, 2000

Attest:

Q. TODD DICKINSON

*Attesting Officer*      *Director of Patents and Trademarks*